(12) United States Patent
Yamauchi

(10) Patent No.: US 7,187,596 B2
(45) Date of Patent: Mar. 6, 2007

(54) SEMICONDUCTOR SYSTEM HAVING A SOURCE POTENTIAL SUPPLY SECTION

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 178 days.

(21) Appl. No.: 11/097,359

(22) Filed: Apr. 4, 2005

(65) Prior Publication Data

US 2005/0219921 A1 Oct. 6, 2005

(30) Foreign Application Priority Data

Apr. 6, 2004 (JP) ............................. 2004-112015

(51) Int. Cl.
*G11C 5/14* (2006.01)
(52) U.S. Cl. ............................. 365/189.09; 365/189.11; 365/226; 365/156; 714/726
(58) Field of Classification Search .......... 365/189.09, 365/189.11, 156, 104, 226; 714/726
See application file for complete search history.

(56) References Cited

U.S. PATENT DOCUMENTS 6,078,539 A 6/2000 Dvir
6,181,625 B1 1/2001 Hibino
6,407,956 B2 6/2002 Ooishi
6,934,210 B2 * 8/2005 Akiba et al. ................. 365/222
2002/0017947 A1 * 2/2002 Ooishi et al. ................ 327/544
2002/0091978 A1 * 7/2002 Higashida .................... 714/726
2004/0190351 A1 * 9/2004 Fujimoto ................ 365/189.07

FOREIGN PATENT DOCUMENTS

JP 2001-044295 2/2001
JP 2003-007863 1/2003

* cited by examiner

*Primary Examiner*—Tuan T. Nguyen
*Assistant Examiner*—Toan Le
(74) *Attorney, Agent, or Firm*—McDermott Will & Emery LLP

(57) ABSTRACT

A semiconductor system includes a plurality of memory systems (SARM, ROM, etc.) and circuit systems. The semiconductor system further includes an analog power supply circuit which is common to the memory systems. The analog power supply circuit supplies a source potential to word line drivers of the memory systems. The source potential is set to a potential different from a ground potential and a supply voltage of the semiconductor system.

14 Claims, 15 Drawing Sheets

SEMICONDUCTOR SYSTEM HAVING A SOURCE POTENTIAL SUPPLY SECTION

CROSS-REFERENCE TO RELATED APPLICATION

This application claims priority under 35 U.S.C. §119(a) on Japanese Patent Application No. 2004-112015 filed on Apr. 6, 2004, the entire contents of which are hereby incorporated by reference.

BACKGROUND OF THE INVENTION

1. Field of the Invention

The present invention relates to a semiconductor system including a plurality of memory systems, such as SRAMs, ROMs, and the like.

2. Description of the Prior Art

A conventional structure of a semiconductor system which includes a plurality of memory systems, circuit systems, or the like, is described below.

For example, an additional circuit, such as a level shifter, or the like, is provided or complicated well separation, or the like, is formed because the level of the supply voltage on a chip is not only one level and, specifically, it is necessary to provide three or more levels of supply voltages on the same chip (see, for example, Japanese Unexamined Patent Publication No. 2001-44295 (pp. 2–7, FIG. 1)). In the case of including a system which requires a high voltage for circuit operation, such as a flash memory, or the like, a high breakdown voltage gate oxidation film process is added to a standard process which is necessary for forming a logic device (see, for example, Japanese Unexamined Patent Publication No. 2003-7863 (pp. 2–7, FIG. 1)). Specifically, assuming that, for example, a logic section requires 1.0 V, a flash memory requires 3.0 V, and a DRAM requires 2.5 V, a gate oxide film, or the like, is formed in each of these elements to withstand the required voltage.

In the case where numerous types of memory devices and analog devices are incorporated in a single chip, it is estimated that more than five levels of optimum voltages are required as miniaturization advances in the future. Accordingly, more than five types of gate oxide films are required. It is extremely difficult to form such a device through the same process. That is, it is difficult to realize such a device with the conventional techniques disclosed in the above publications.

As an alternative technique, providing numerous levels of threshold voltages instead of providing various types of gate oxide films can be considered. However, in this case, the possibility of an off leak current due to an excessively low threshold voltage of a transistor and the possibility of a gate leak current due to an excessively thin gate oxidation film increase.

Further, as shown in FIG. 15, the threshold voltage differs among systems due to device miniaturization depending on the device layout, such as channel width, separation width, etc. Especially, since an SRAM, ROM, DRAM, and the like, use a very small device, the threshold voltages of systems are different even if the systems are produced through the same process. Thus, it is difficult to satisfy the leak current requirements in all of the memories. Since an analog circuit, or the like, uses a large device, it is extremely difficult to satisfy the leak current requirements in the analog circuit while satisfying the leak current requirements in all memory devices. In the example of FIG. 15, the threshold voltage is different among systems by 200 mV. For example, adjusting the threshold voltage of each system by ion implantation through a production process can be considered. However, in many cases, more than 10 levels of threshold voltages (n-channel and p-channel) have to be adjusted. This is, practically, almost impossible in view of the actual production cost.

In many semiconductor systems, the supply voltage and the clock frequency are controlled according to the amount of task processing, the task status in operation, on standby, or the like, or the system temperature. Thus, the specifications of the leak current differ depending on the circumstances. Therefore, it is necessary to flexibly change control of the leak current according to the operation environment of the system. However, it is difficult to follow variations in the operation environment of the entire system only by process adjustments and/or only with a leak reduction circuit provided to each memory. As a result, the requirements as to the off leak current and gate leak current cannot be satisfied.

SUMMARY OF THE INVENTION

In view of the above problems, an objective of the present invention is to provide a semiconductor system including memory systems which have different threshold voltages wherein the leak current can be restricted without using a complicated process irrespective of the difference in threshold voltage.

In order to achieve the above objective, the first invention is a semiconductor system, comprising: a plurality of memory systems which have different threshold voltages; and a source potential supply section which is common to the plurality of memory systems, the source potential supply section supplying a source potential to at least one transistor included in a memory cell of each of the memory systems, wherein the source potential is set to a potential different from a ground potential and a supply voltage of the semiconductor system.

According to this invention, a source potential is commonly supplied from the source potential supply section to transistors of memory cells of the memory systems. With this structure, the voltage between the gate and the source, which determines the off leak current, is controlled in a collective manner throughout the memory systems to be a negative voltage whose absolute value is equal to or greater than a predetermined value. Thus, in the memory systems having different threshold voltages, the leak current can be restricted without being influenced by the difference in threshold voltage.

In the first invention, the transistor to which the source potential is supplied from the source potential supply section is preferably an access transistor.

In the first invention, preferably, the plurality of memory systems include an SRAM; and in the SRAM, the transistor to which the source potential is supplied from the source potential supply section is a load transistor.

In the first invention, the source potential is preferably set to a positive potential whose absolute value is equal to or smaller than 20% of the supply voltage of the semiconductor system.

In the first invention, the source potential is preferably set to a potential whose absolute value is equivalent to a difference between a lowest one of threshold voltages of the memory systems and a highest one of threshold voltages of circuit systems included in the semiconductor system.

With the above structures, an influence of greatly-different threshold voltages caused according to the device size and layout is surely avoided.

In the first invention, preferably, at least one of the plurality of memory systems includes a source driver for supplying to a memory cell selected for access the ground potential as a source potential in substitution for the source potential supplied from the source potential supply section.

The second invention is a semiconductor system, comprising: a plurality of memory systems which have different threshold voltages; and a source potential supply section which is common to the plurality of memory systems, the source potential supply section supplying a source potential to a word line driver of each of the memory systems, wherein the source potential is set to a potential different from a ground potential and a supply voltage of the semiconductor system.

According to this invention, a source potential is commonly supplied from the source potential supply section to word line drivers of the memory systems. With this structure, the voltage between the gate and the source, which determines the off leak current, is controlled in a collective manner throughout the memory systems to be a negative voltage whose absolute value is equal to or greater than a predetermined value. Thus, in the memory systems having different threshold voltages, the leak current can be restricted without using a complicated process and without being influenced by the difference in threshold voltage.

In the second invention, the source potential is preferably set to a negative potential whose absolute value is equal to or smaller than 20% of the supply voltage of the semiconductor system.

In the second invention, the source potential is preferably set to a potential whose absolute value is equivalent to a difference between a lowest one of threshold voltages of the memory systems and a highest one of threshold voltages of circuit systems included in the semiconductor system.

With the above structures, an influence of greatly-different threshold voltages caused according to the device size and layout is surely avoided.

Preferably, the first or second invention further comprises a circuit system, wherein the plurality of memory systems are provided together with the circuit system on the same chip to constitute a system LSI.

In the first or second invention, the source potential supply section preferably has a function of controlling the source potential according to at least any one of the operation frequency, supply voltage and temperature of the semiconductor system.

With the above structures, the leak current can be flexibly controlled according to the operation environment of the system.

In the first or second invention, preferably, the source potential supply section includes a reference voltage generation section for generating a reference voltage as a reference for the source potential, and the semiconductor system further comprises a voltage controlled driver for generating the source potential which is to be supplied to each of the memory systems according to the reference voltage.

With this structure, the source potentials having different values are controlled in a collective manner according to the reference voltage.

Preferably, the reference voltage generation section has a function of controlling the reference voltage according to at least any one of the operation frequency, supply voltage and temperature of the semiconductor system.

With this structure, the leak current can be flexibly controlled according to the operation environment of the system.

Preferably, the first or second invention further comprises a substrate potential supply section which is common to the plurality of memory systems, the substrate potential supply section supplying a substrate potential to the memory systems.

According to the present invention, the leak current can be restricted without using a complicated process and without being influenced by the difference in threshold voltage. That is, the leak current related problems in a semiconductor system which includes a plurality of memory systems can be alleviated without increasing the cost of production process.

Further, control of the leak current can be flexibly changed in a collective manner throughout the memory systems according to the operation environment of the system. As a result, the leak current specifications can be satisfied irrespective of the system status.

DESCRIPTION OF THE PREFERRED EMBODIMENTS

Hereinafter, embodiments of the present invention are described with reference to the drawings.

Embodiment 1

Figure 1:
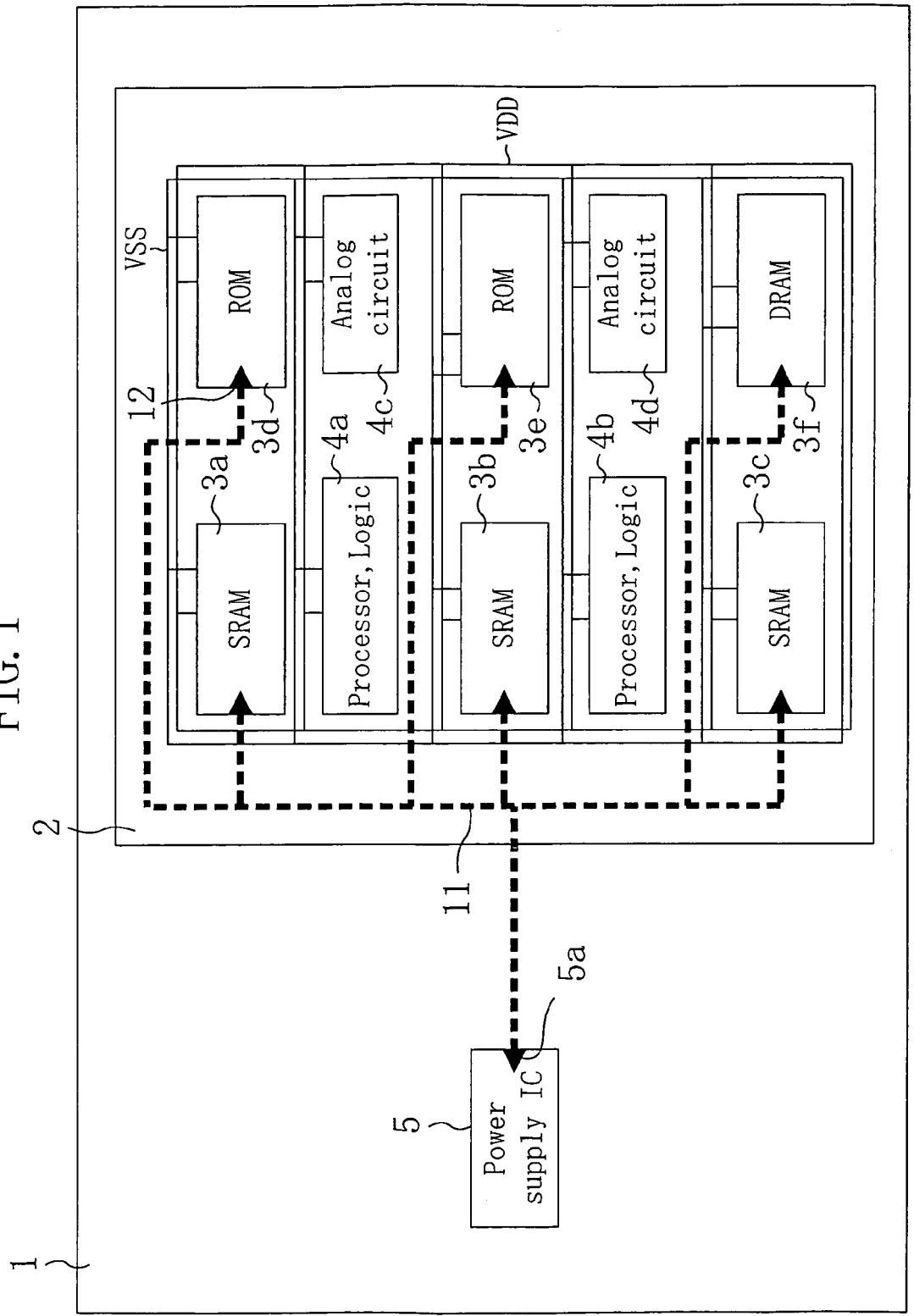
FIG. 1 shows a structure of a semiconductor system according to embodiment 1 of the present invention.

FIG. 1 is a block diagram showing a structure of a semiconductor system according to embodiment 1 of the present invention. In FIG. 1, the semiconductor system 1 includes a system LSI 2 which incorporates a plurality of memory systems, SRAMs 3a, 3b and 3c, ROM 3d and 3e, and a DRAM 3f. The system LSI 2 incorporates circuit systems 4a, 4b, 4c and 4d in addition to the memory systems. The SRAMs 3a, 3b and 3c, the ROM 3d and 3e, and the DRAM 3f have different operation principles and accordingly have different threshold voltages. Even among memory systems having the same operation principle, if the position on the layout, the size, or the like, differs, there is a possibility that a difference in threshold voltage is caused due to production processes.

The semiconductor system 1 of FIG. 1 includes an analog power supply circuit (source potential supply section) 5. The analog power supply circuit 5 is common to the memory systems 3a to 3f and supplies a source potential to at least one transistor included in a memory cell of each of the memory systems 3a to 3f. The source potential generated by the analog power supply circuit 5 is supplied from a power outlet 5a through a source potential supply line 11 to a power inlet 12 of each of the memory systems 3a to 3f. This source potential is set to a potential different from ground potential VSS and supply voltage VDD of the semiconductor system 1.

In this example, the analog power supply circuit 5 and the system LSI 2 are on different chips, and the analog power supply circuit 5 can supply the supply voltage to the system LSI 2. It should be noted that the semiconductor system 1 may be formed on the same (single) board. Alternatively, the semiconductor system 1 may be formed in the same (single) package. Still alternatively, the semiconductor system 1 may be formed on the same (single) semiconductor substrate.

Figure 2:
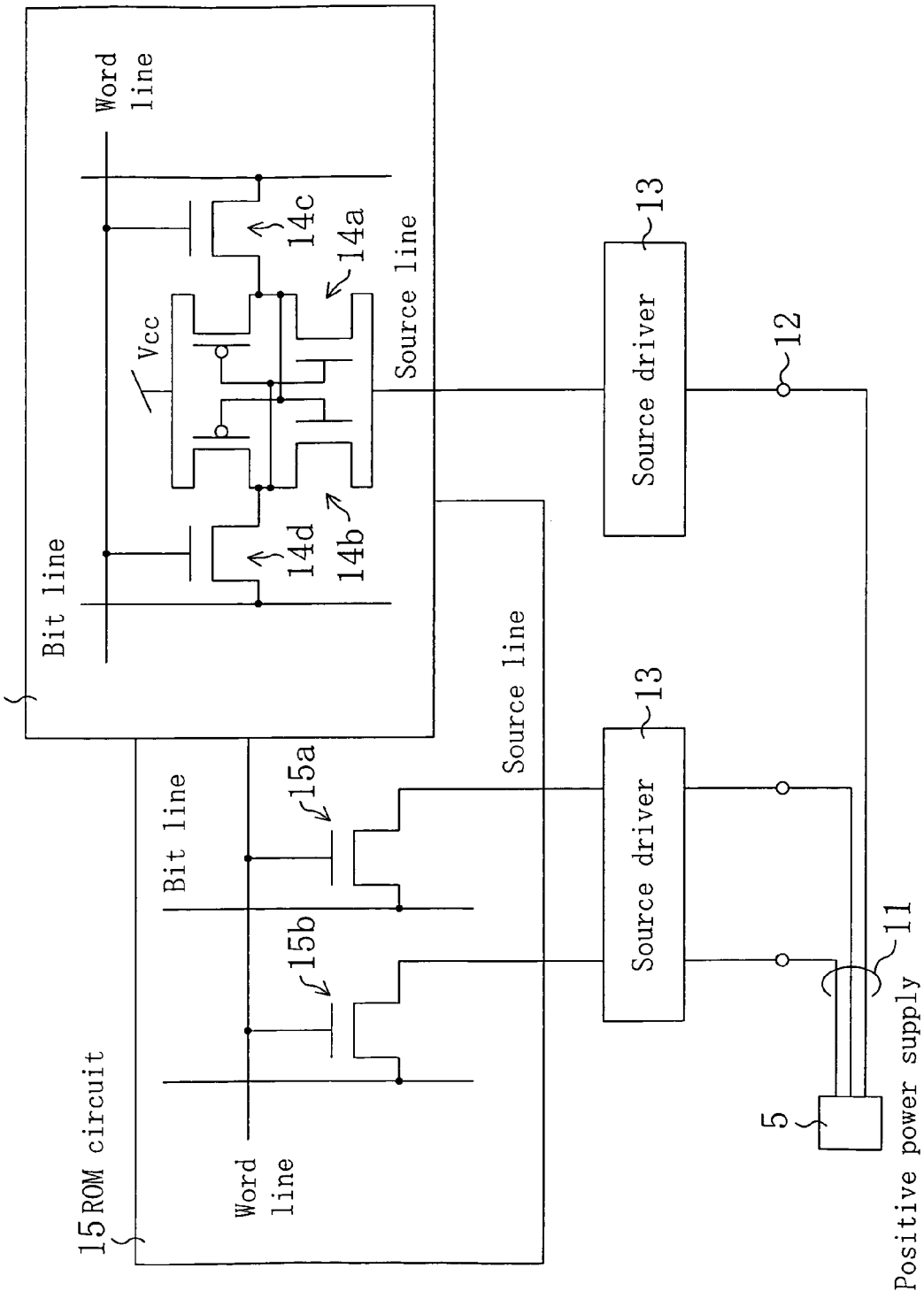
FIG. 2 shows an exemplary structure of a part of each memory system of FIG. 1 which relates to supply of a source potential.

FIG. 2 shows an exemplary structure of a part of each memory system which relates to supply of the source potential according to embodiment 1. The exemplary memory systems of FIG. 2 include SRAM and ROM. The internal structures of memory cells of SRAM and ROM are referred to as "SRAM circuit 14" and "ROM circuit 15", respectively. In a memory cell including 6 transistors in the SRAM circuit 14, the aforementioned source potential is supplied through a source driver 13 to the common source of NMOS drive transistors 14a and 14b. The drive transistors 14a and 14b determine a cell current. In the meanwhile, access transistors 14c and 14d connected to a word line are indirectly supplied with the aforementioned source potential through the drive transistors 14a and 14b.

In the ROM circuit 15, a memory cell is formed by one transistor. Thus, the sources of transistors 15a and 15b, which are not connected to a bit line, are supplied with the aforementioned source potential through the source driver 13. The transistors 15a and 15b correspond to the access transistor and determine a cell current.

Although not shown, in the case of a DRAM, the source of a read transistor of a 2T-1C type cell (where a read bit line and write bit line are separated) is supplied with the aforementioned source potential, whereas the source portion of a 1T-1C type cell functions as a capacitor. In the case of FLASH or MRAM, a memory cell is a 1T type cell, and therefore, the source of the transistor is supplied with the aforementioned source potential.

As described above, according to embodiment 1, the transistors included in memory cells of the memory systems 3a to 3f are commonly supplied with the source potential from the analog power supply circuit (source potential supply section) 5. With such a structure, the voltage between the gate and the source, which determines the off leak current, is controlled in a collective manner throughout the memory systems 3a to 3f to be a negative voltage whose absolute value is equal to or greater than a predetermined value. Thus, in the memory systems having different threshold voltages, the leak current can be restricted without being influenced by the difference in threshold voltage.

In embodiment 1, the source potential is preferably set to a positive potential whose absolute value is equal to or smaller than 20% of supply voltage VDD of the semiconductor system 1. For example, when supply voltage VDD is 1.0 V, the source potential is preferably set to a positive potential equal to or smaller than 0.2 V.

Figure 15:
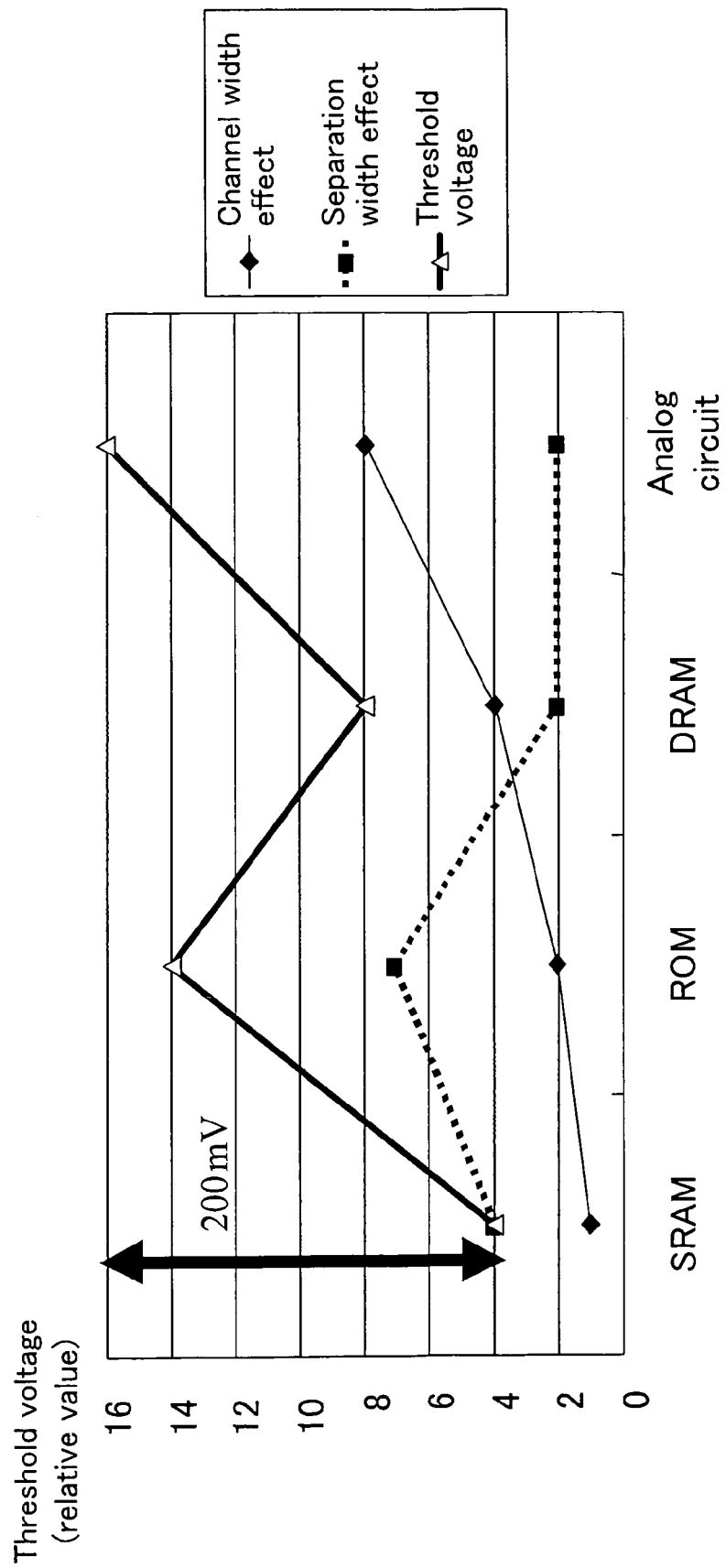
FIG. 15 is a graph showing an example of variations in the characteristics among systems.

In embodiment 1, the source potential is preferably set to a potential whose absolute value is equivalent to the difference between the lowest one of the threshold voltages of the memory systems 3a to 3f and the highest one of the threshold voltages of the other circuit systems. In the example of FIG. 15, the source potential is preferably set to 200 mV. With this, an influence caused by a variation in threshold voltage is surely avoided.

Embodiment 2

Figure 3:
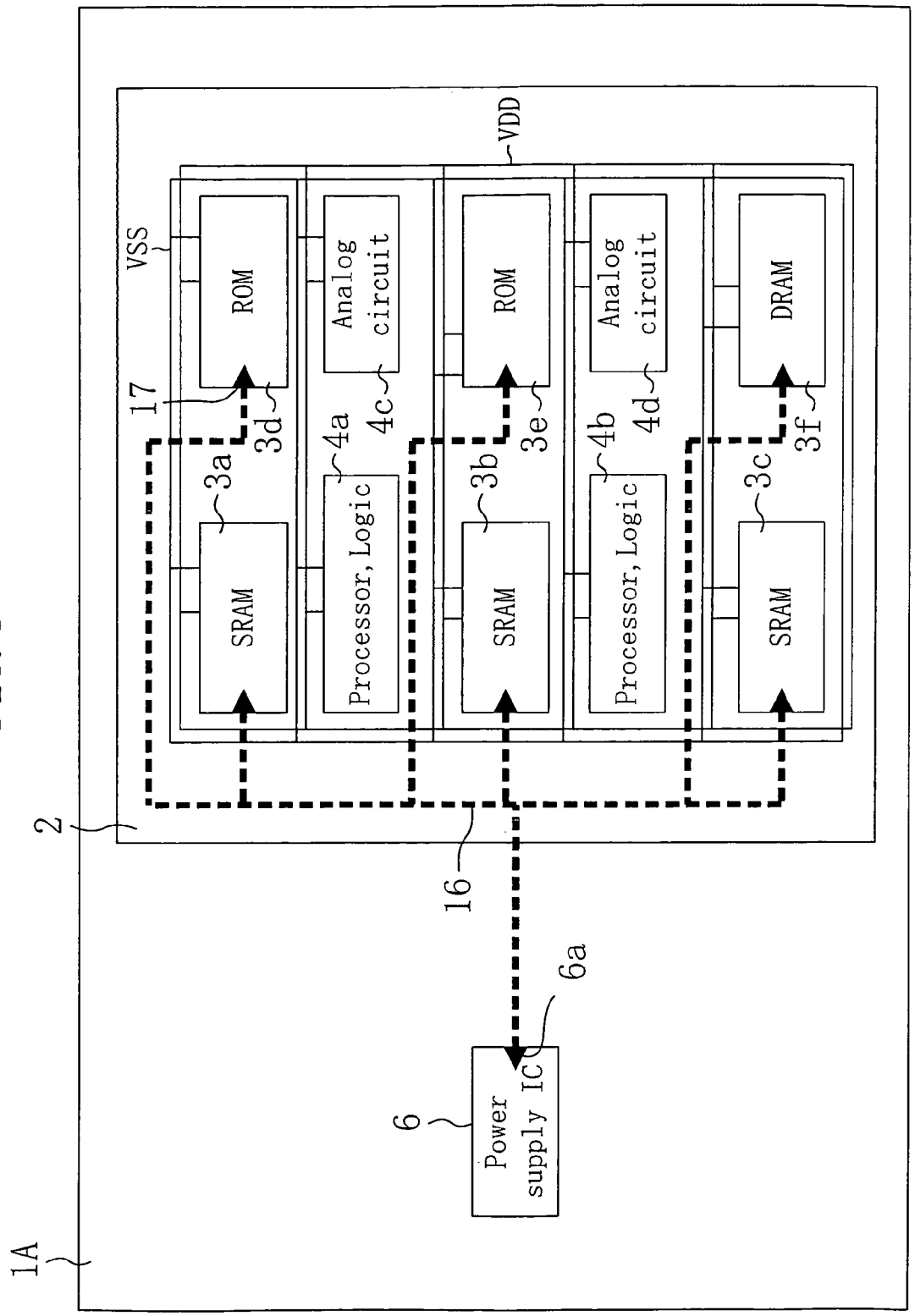
FIG. 3 shows a structure of a semiconductor system according to embodiment 2 of the present invention.

FIG. 3 is a block diagram showing a structure of a semiconductor system according to embodiment 2 of the present invention. In FIG. 3, the same elements as those of FIG. 1 are denoted by the same reference numerals used in FIG. 1, and the detailed descriptions thereof are herein omitted.

The semiconductor system 1A of FIG. 3 includes an analog power supply circuit (source potential supply section) 6. The analog power supply circuit 6 is common to the memory systems 3a to 3f and supplies a source potential to word line drivers of the memory systems 3a to 3f. The source potential generated by the analog power supply circuit 6 is supplied from a power outlet 6a through a source potential supply line 16 to a power inlet 17 of each of the memory systems 3a to 3f. This source potential is set to a potential different from ground potential VSS and supply voltage VDD of the semiconductor system 1A.

In this example, the analog power supply circuit 6 and the system LSI 2 are on different chips, and the analog power supply circuit 6 can supply the supply voltage to the system LSI 2. It should be noted that the semiconductor system 1 may be formed on the same (single) board. Alternatively, the semiconductor system 1 may be formed in the same (single) package. Still alternatively, the semiconductor system 1 may be formed on the same (single) semiconductor substrate.

Figure 4:
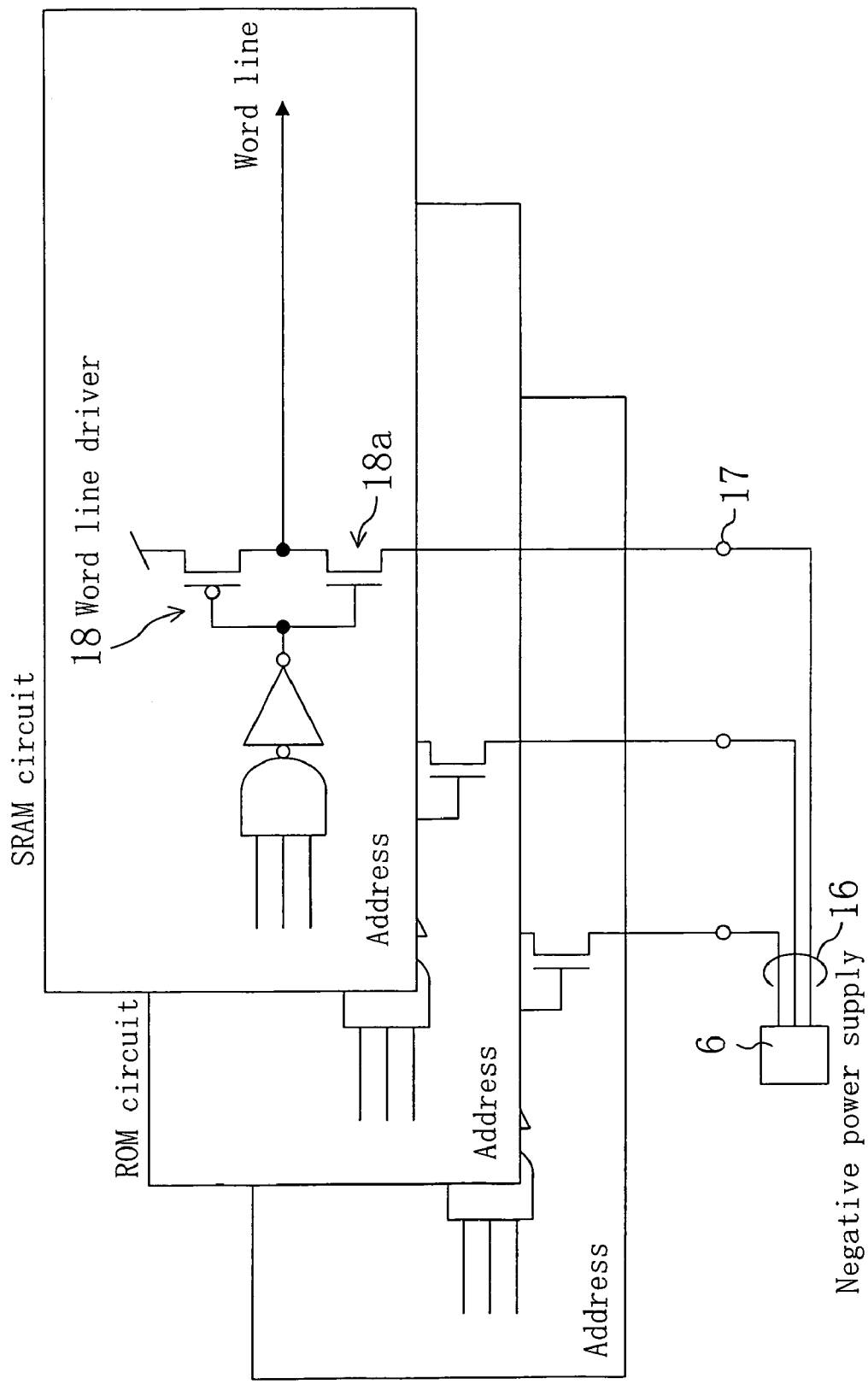
FIG. 4 shows an exemplary structure of a part of each memory system of FIG. 3 which relates to supply of a source potential.

FIG. 4 shows a structure of a part of each memory system which relates to supply of a source potential. As shown in FIG. 4, the aforementioned source potential is supplied as the source potential of a word line driver 18 which determines the pull-down potential of a word line. The source potential of the word line driver 18 herein means a source potential of an NMOS transistor 18a of an inverter which drives a control line for selecting a word in any of SRAM, ROM, DRAM and MRAM.

As described above, according to embodiment 2, the word line drivers of the memory systems 3a to 3f are commonly supplied with the source potential from the analog power supply circuit (source potential supply section) 6. With such a structure, the voltage between the gate and the source, which determines the off leak current, is controlled in a collective manner throughout the memory systems 3a to 3f to be a negative voltage whose absolute value is equal to or greater than a predetermined value. Thus, in the memory systems having different threshold voltages, the leak current can be restricted without being influenced by the difference in threshold voltage.

In embodiment 2, the source potential is preferably set to a negative potential whose absolute value is equal to or smaller than 20% of supply voltage VDD of the semiconductor system 1A. For example, when supply voltage VDD is 1.0 V, the source potential is preferably set to a negative potential equal to or greater than −0.2 V.

In embodiment 2, the source potential is preferably set to a potential whose absolute value is equivalent to the difference between the lowest one of the threshold voltages of the memory systems 3a to 3f and the highest one of the threshold voltages of the other circuit systems. In the example of FIG. 15, the source potential is preferably set to 200 mV. With this, an influence caused by a variation in threshold voltage is surely avoided.

Embodiment 3

Figure 5:
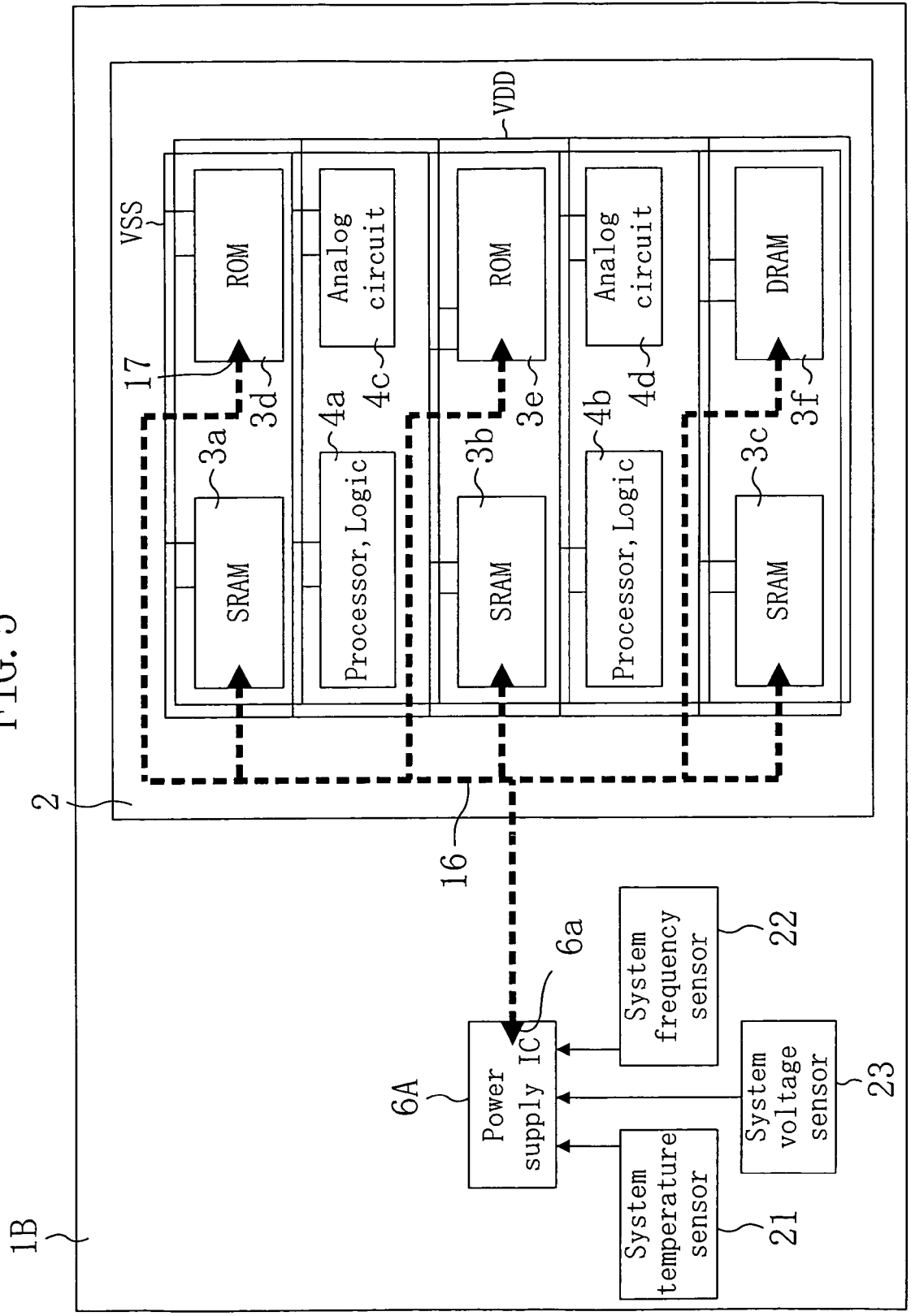
FIG. 5 shows a structure of a semiconductor system according to embodiment 3 of the present invention.

FIG. 5 is a block diagram showing a structure of a semiconductor system according to embodiment 3 of the present invention. In FIG. 5, the same elements as those of FIG. 3 are denoted by the same reference numerals used in FIG. 3, and the detailed descriptions thereof are herein omitted.

The semiconductor system 1B of FIG. 5 includes a system temperature sensor 21 for detecting the temperature of the semiconductor system 1B, a system frequency sensor 22 for detecting the operation frequency of the semiconductor system 1B, and a system voltage sensor 23 for detecting the supply voltage of the semiconductor system 1B. The semiconductor system 1B further includes an analog power supply circuit (source potential supply section) 6A which has a function of controlling the source potential that is to be supplied to the word line drivers of the memory systems 3a to 3f according to at least any one of the temperature detected by the system temperature sensor 21, the operation frequency detected by the system frequency sensor 22, and the supply voltage detected by the system voltage sensor 23.

Figure 6:
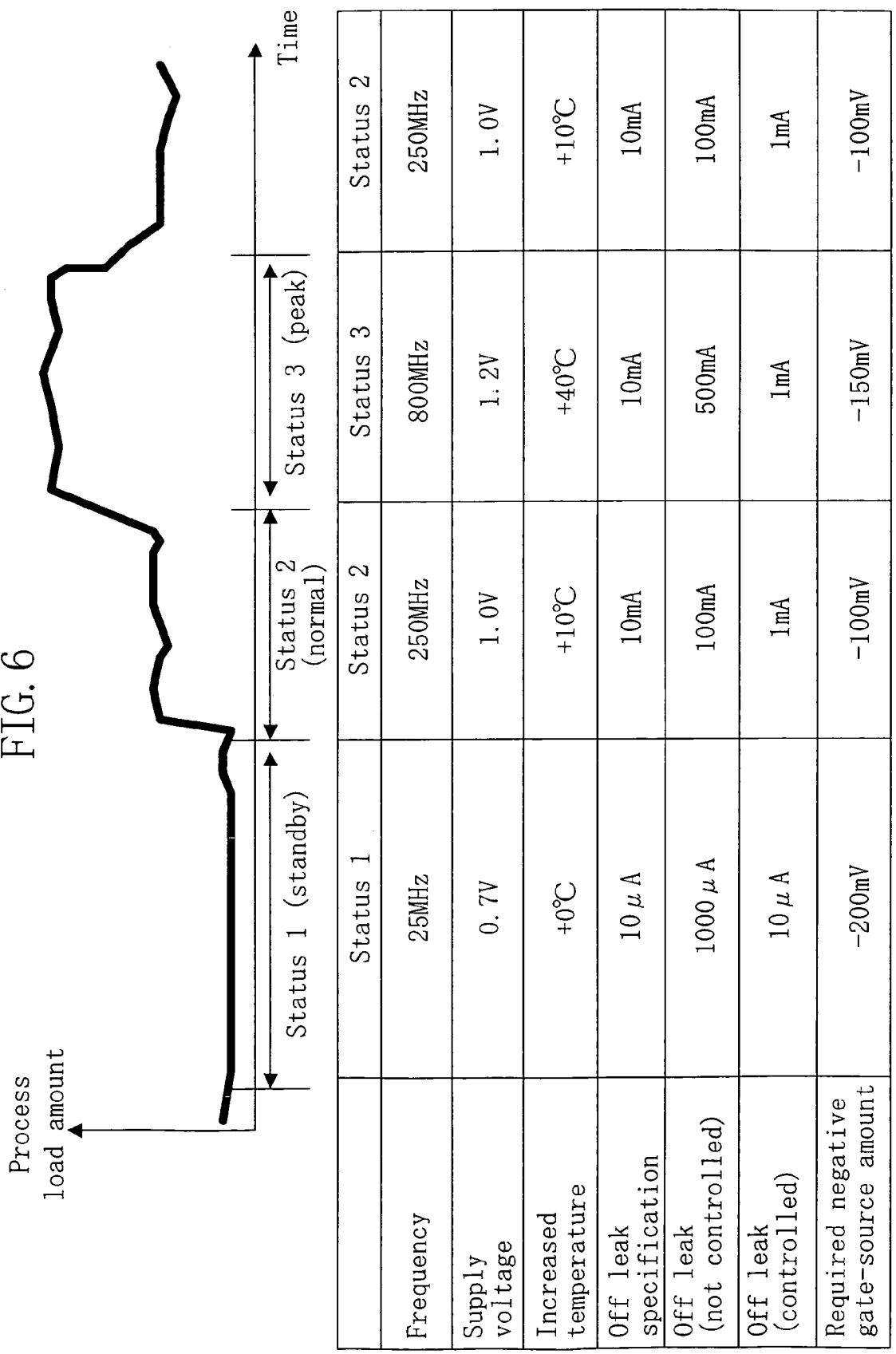
FIG. 6 shows an example of the relationship between the amount of process load of a system and the status of the system.

FIG. 6 shows an example of the relationship between a variation in the amount of process load, i.e., a variation in the amount of tasks which are to be processed by a system, and the status of the system. As shown in FIG. 6, the supply voltage and the operation frequency of the system are controlled to have different values according to the status of the system, e.g., status 1 (standby), status 2 (normal load) and status 3 (load peak). As shown in FIG. 6, the specifications as to the leak current, such as an off leak to be satisfied, or the like, are also determined according to the status of the system. However, the temperature of the system also changes according to variations in the supply voltage and operation frequency.

Thus, according to embodiment 3, the off leak requirements can be readily satisfied whichever status the system is in by commonly controlling the source potential which is to be supplied to the word line drivers of the memory systems 3a to 3f according to the operation frequency, the supply voltage and the temperature. In the example of FIG. 6, the source potential is set to −200 mV, −100 mV and −150 mV for status 1, status 2 and status 3, respectively. It should be noted that restriction of the leak current by control of the source potential is possible to some extent by using at least one of the operation frequency, the supply voltage and the temperature.

Although not shown in FIG. 6, if the requirements as to the leak current in the standby mode become more exacting, a difference in temperature characteristic between the off leak current and the gate leak current is a critical factor. That is, since the off leak has a large temperature characteristic whereas the gate leak has a small temperature characteristic, the off leak current is dominant in the entire leak current at high temperature, but the gate leak current is dominant in the entire leak current at normal temperature. Controlling the voltage between the gate and the source directly contributes to restriction of the off leak current but only indirectly contributes to restriction of the gate leak current. Thus, even if the system stays in the same status, the source potential is preferably set to −200 mV (at 125° C.) or −100 mV (at 25° C.) in some cases. According to embodiment 3, even such a control method can readily be realized.

Embodiment 4

In the above embodiments, the source potential is directly supplied to the memory systems 3a to 3f from the analog power supply circuit 5, 6 or 6A. In embodiment 4, however, a reference voltage is generated as a reference for the source potential, and which way (increase or decrease) and how much the source potential is changed are determined based on the reference voltage, instead of directly supplying the power from the analog power supply circuit.

Figure 7:
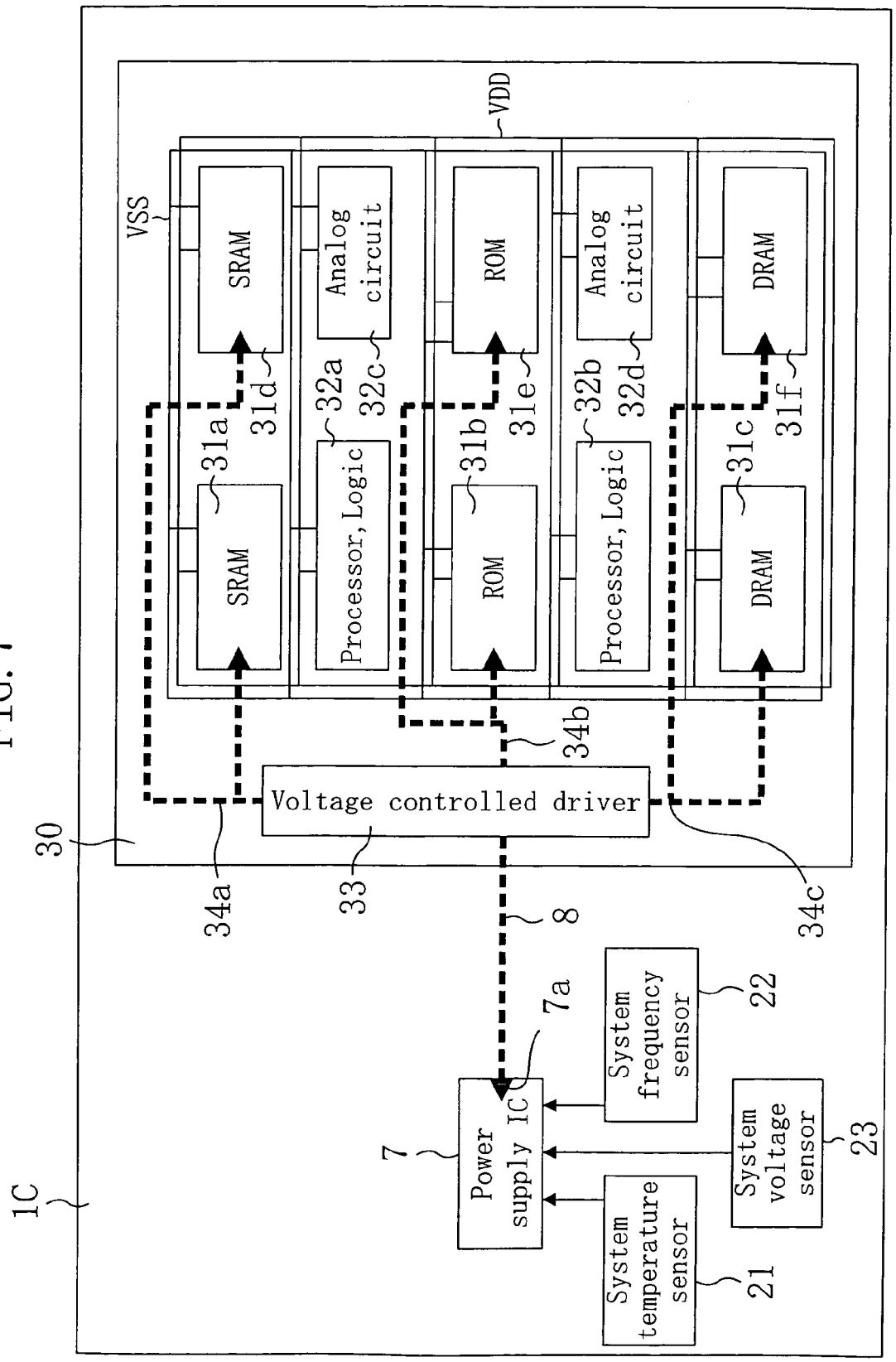
FIG. 7 shows a structure of a semiconductor system according to embodiment 4 of the present invention.

FIG. 7 is a block diagram showing a structure of a semiconductor system according to embodiment 4 of the present invention. In FIG. 7, the same elements as those of FIG. 5 are denoted by the same reference numerals used in FIG. 5, and the detailed descriptions thereof are herein omitted.

In FIG. 7, the semiconductor system 1C includes a system LSI 30 which incorporates a plurality of memory systems, SRAMs 31a and 31d, ROM 31b and 31e, and DRAMs 3c and 3f. The system LSI 30 incorporates circuit systems 32a, 32b, 32c and 32d in addition to the memory systems. The semiconductor system 1C further includes an analog power supply circuit (reference voltage generation section) 7. The analog power supply circuit 7 is common to the memory systems 31a to 31f and generates a reference voltage as a reference for the source potential that is supplied to the word line drivers of the memory systems 31a to 31f. The reference voltage is supplied from a power supply outlet 7a. The analog power supply circuit 7 has a function of controlling the reference voltage according to at least any one of the temperature detected by the system temperature sensor 21, the operation frequency detected by the system frequency sensor 22, and the supply voltage detected by the system voltage sensor 23.

The system LSI 30 includes a voltage controlled driver 33 for supplying the source potential to the memory systems 31a to 31f. The voltage controlled driver 33 generates a source potential for each of SRAM, ROM and DRAM according to the reference voltage supplied from the analog power supply circuit 7 through a reference voltage line 8. The source potential for SRAM is supplied through a source potential supply line 34a to SRAMs 31a and 31d. In the meanwhile, the source potential for ROM is supplied through a source potential supply line 34b to ROMs 31b and 31e, and the source potential for DRAM is supplied through a source potential supply line 34c to DRAMs 31c and 31f. The analog power supply circuit 7 and the voltage controlled driver 33 constitute a source potential supply section.

Figure 8:
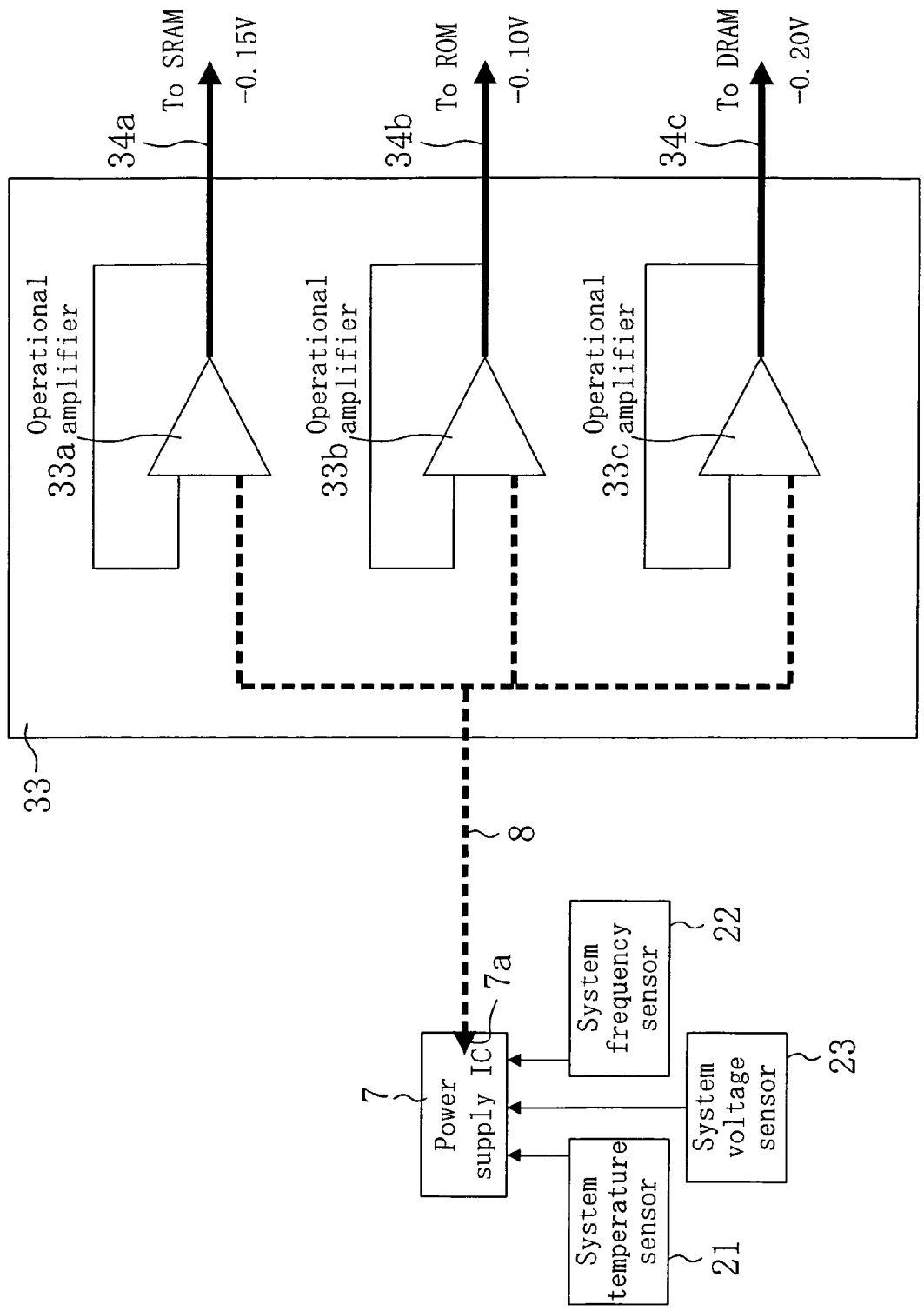
FIG. 8 shows an example of an internal structure of a voltage controlled driver of FIG. 7.

FIG. 8 shows an example of an internal structure of the voltage controlled driver 33 of FIG. 7. In FIG. 8, the voltage controlled driver 33 includes an operational amplifier 33a for SRAM, an operational amplifier 33b for ROM, and an operational amplifier 33c for DRAM. The operational amplifiers 33a, 33b and 33c each receive the reference voltage supplied from the analog power supply circuit 7 to generate a source potential based on the reference voltage. In the example of FIG. 8, the source potential generated for SRAM is −0.15 V, the source potential generated for ROM is −0.10 V, and the source potential generated for DRAM is −0.20 V.

Thus, according to embodiment 4, a reference voltage is generated as a reference for the source potential, and source potentials which are to be supplied to the memory systems 31*a* to 31*f* are generated based on the reference voltage. With this structure, the source potentials having different values can be supplied to the memory systems 31*a* to 31*f*, and the voltage between the gate and the source, which determines the off leak current, can be controlled in a collective manner. For example, different source potentials generated for respective memory types, SRAM, ROM and DRAM, can be supplied while the way the voltage changes due to environmental variations is controlled in a collective manner.

The power supply channel from the analog power supply circuit 7 to the system LSI 30 only requires a channel for supplying the reference voltage. Thus, an increase in the number of layers of a board can be suppressed, and therefore, the cost of the entire system can be reduced.

As a matter of course, even in a case where the source potential is supplied to a transistor included in a memory cell as described in embodiment 1, the reference voltage can be used as in embodiment 4.

Embodiment 5

In the above embodiments, the examples of a semiconductor system including memory systems which operate based on different operation principles have been described. However, even in a semiconductor system including a plurality of memory systems which operate based on the same operation principle, the above-described effects of the present invention can be achieved by using the above-described features. For example, even the memory systems having the same operation principle can have different threshold voltages if the position on the layout, the size, or the like, differs. In such a case, the present invention is applied to restrict the leak current without being influenced by the difference in threshold voltage.

Figure 9:
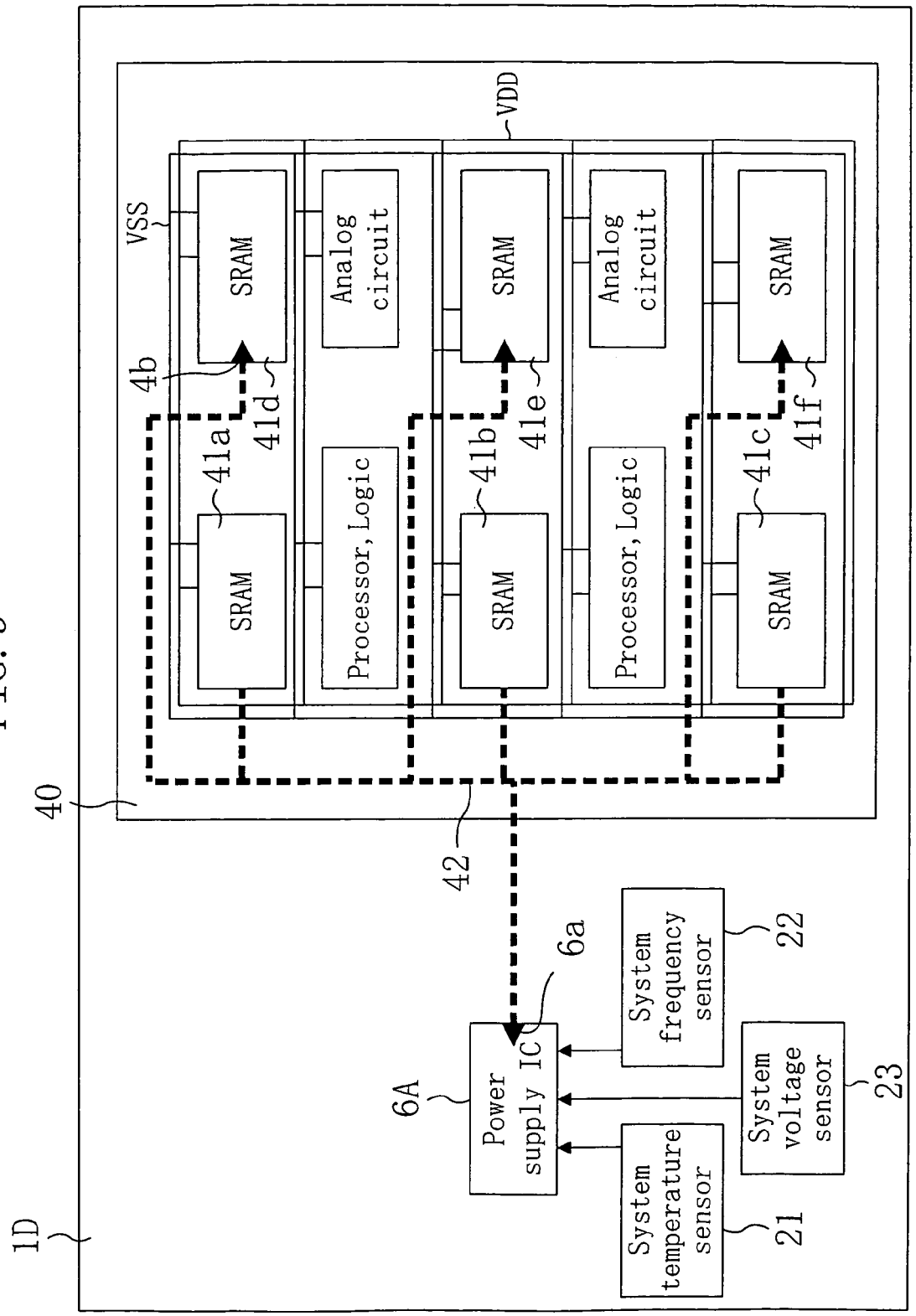
FIG. 9 shows a structure of a semiconductor system according to embodiment 5 of the present invention.

FIG. 9 is a block diagram showing a structure of a semiconductor system according to embodiment 5 of the present invention. The semiconductor system 1D of FIG. 9 has substantially the same structure as that of the semiconductor system 1B of FIG. 5 except that the system LSI 2 is replaced by a system LSI 40 which incorporates a plurality of SRAMs 41*a* to 41*f*. In FIG. 9, the same elements as those of FIG. 5 are denoted by the same reference numerals used in FIG. 5. The source potential generated by the analog power supply circuit 6A is supplied from a power outlet 6*a* through a source potential supply line 42 to a power inlet 46 of each of the SRAMs 41*a* to 41*f*.

Figure 10:
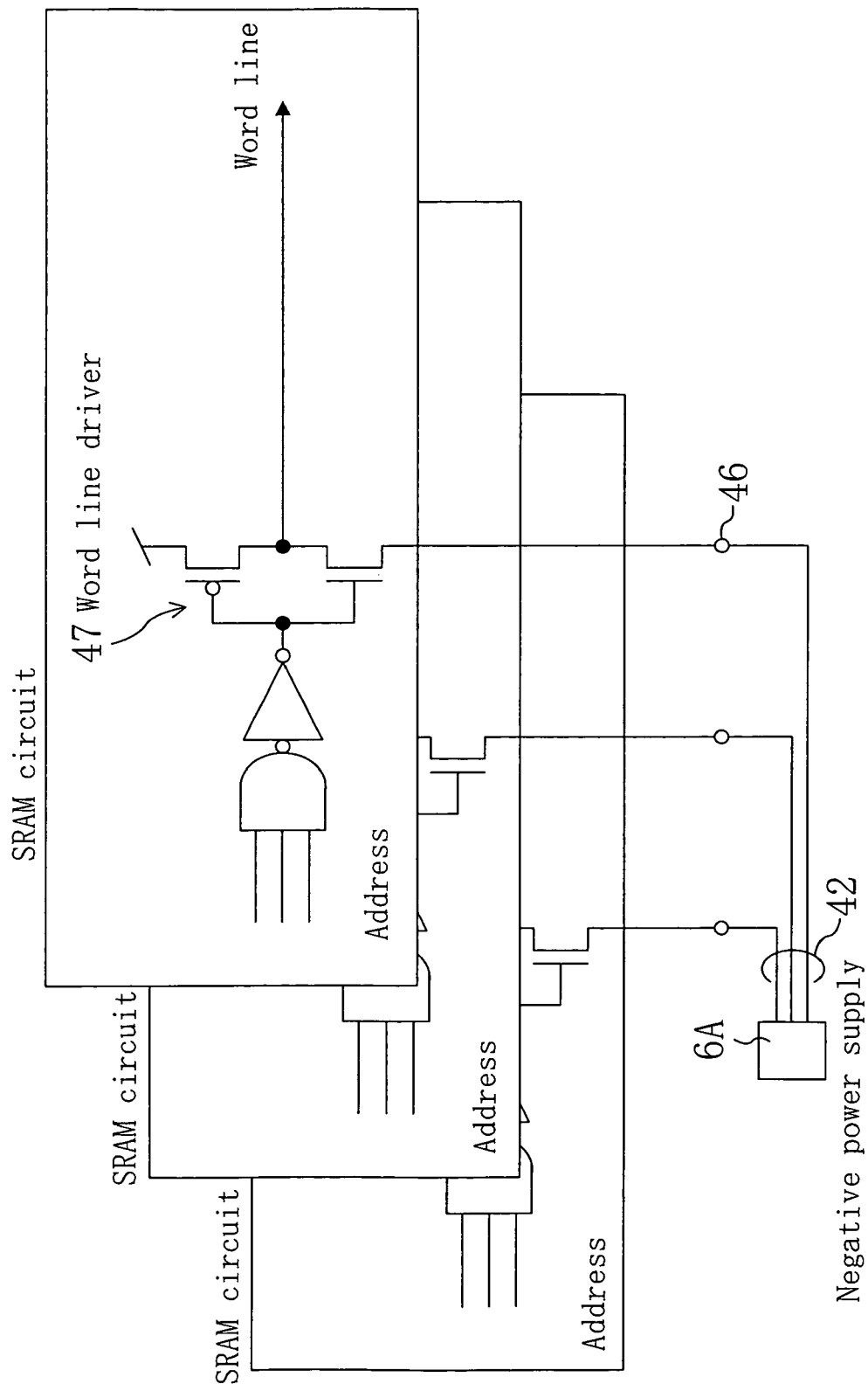
FIG. 10 shows an exemplary structure of a part of each SRAM of FIG. 9 which relates to supply of a source potential.

FIG. 10 shows an exemplary structure of a part of each SRAM which relates to supply of a source potential according to embodiment 5. As shown in FIG. 10, the source potential generated by the analog power supply circuit 6A is supplied as the source potential of a word line driver 47 which determines the pull-down potential of a word line.

Figure 11:
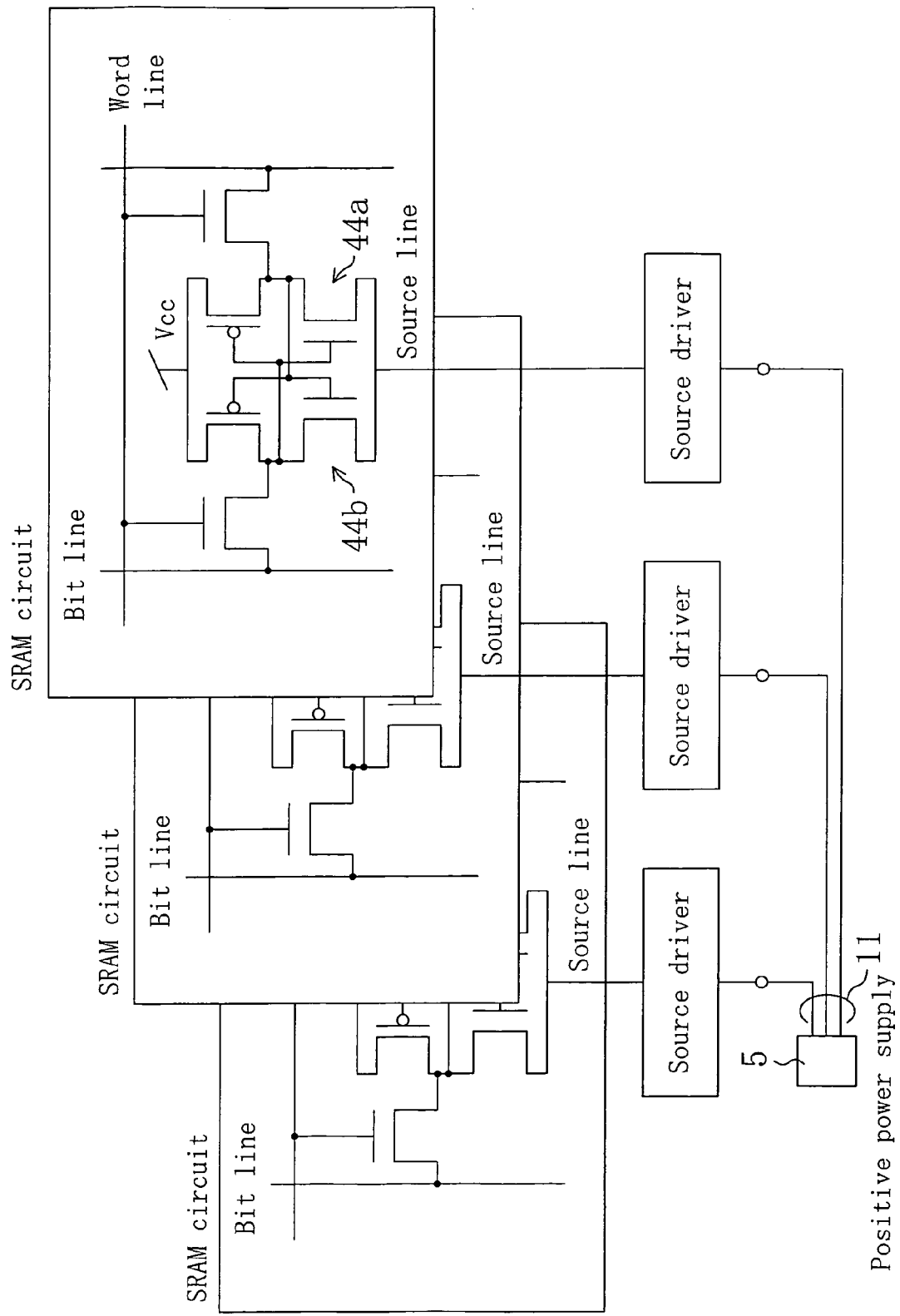
FIG. 11 shows an exemplary structure of a plurality of SRAMs wherein a source potential is commonly supplied to transistors of memory cells.

It should be noted that the above-described effects of the present invention are achieved even in a case where the source potential is commonly supplied to transistors 44*a* and 44*b* of a memory cell of an SRAM as shown in FIG. 11.

Alternatively, a reference voltage which functions as a reference for the source potential may be used as in embodiment 4.

(First Variation)

Figure 12:
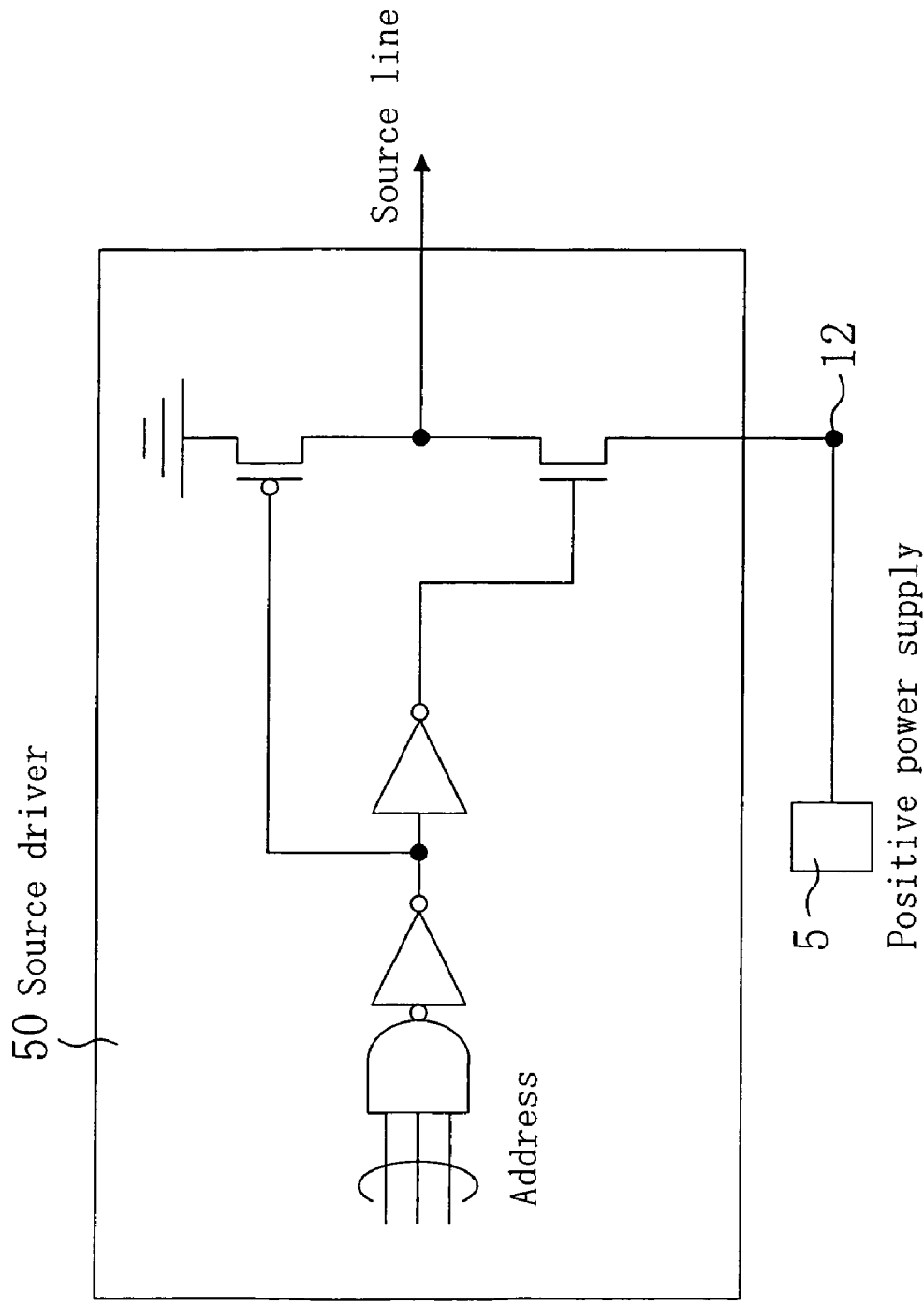
FIG. 12 shows a structure of a source driver according to the first variation of the present invention.

In the case where a source potential is supplied to a transistor of a memory cell as described in embodiment 1, at least one of a plurality of memory systems may have a source driver shown in FIG. 12. When the memory cell is not selected, the source driver 50 of FIG. 12 supplies the source potential supplied from the analog power supply circuit 5 to a source line. When the memory cell is selected, the source driver 50 drives the source line to have a ground potential. With such a structure, the voltage between the gate and the source, which determines the off leak current, is controlled such that the leak current of an unselected memory cell is restricted.

(Second Variation)

In the case where a memory system is an SRAM, the above-described structure where the source potentials of a drive transistor and an access transistor are commonly controlled is applied to control of the source potential of a load transistor which determines the gate voltage of the drive transistor.

Figure 13:
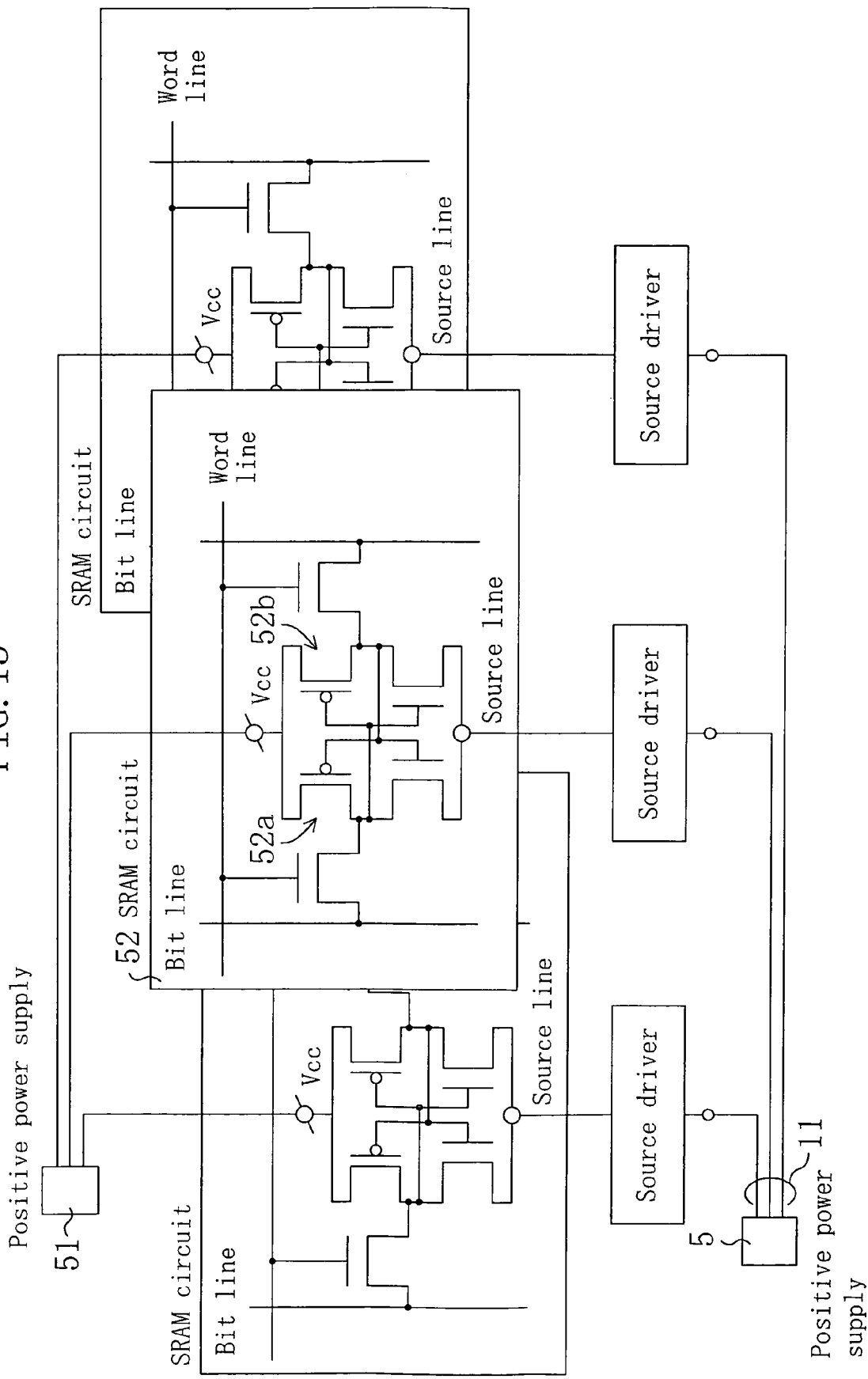
FIG. 13 shows an exemplary structure of a part of a load transistor in an SRAM which relates to supply of a source potential according to the second variation of the present invention.

FIG. 13 shows a structure of a plurality of SRAMs where a source potential is commonly supplied to load transistors. In FIG. 13, there is provided an analog power supply circuit (source potential supply section) 51. The potential output from the analog power supply circuit 51 is commonly supplied to the sources of the load transistors of the SRAMs which include load transistors 52*a* and 52*b* of an SRAM circuit 52.

In the case of increasing the access speed to the SRAM, it is effective to set the source potential of the load transistor at a level higher than the supply voltage of the system by about 100 mV to 200 mV. On the other hand, in order to restrict the leak current of the load transistor, it is effective to set the source potential of the load transistor at a level lower than the supply voltage of the system by about 300 mV to 400 mV. The source potentials of the load transistors are commonly controlled among a plurality of memory systems as shown in FIG. 13, whereby restriction of the leak current in consideration of environmental changes of the system and improvement of the access time are readily realized.

(Third Variation)

Figure 14:
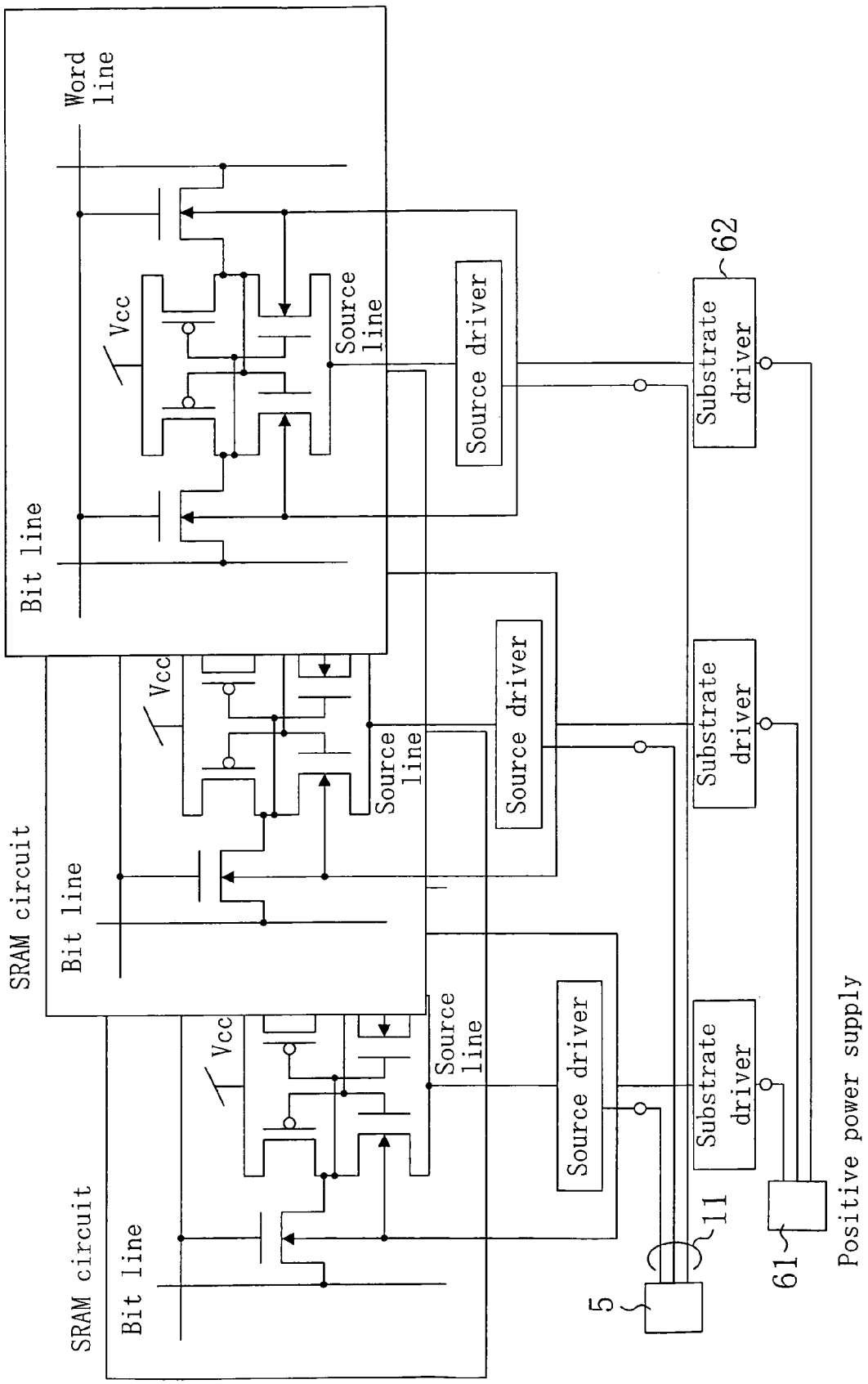
FIG. 14 shows an exemplary structure which relates to supply of a substrate potential according to the third variation of the present invention.

The substrate potential may be commonly controlled among a plurality of memory systems as are the source potential of a transistor of a memory cell and the source potential of a word line driver. FIG. 14 shows a structure of a plurality of SRAMs where a substrate potential is commonly supplied. In FIG. 14, there is provided an analog power supply circuit (substrate potential supply section) 61. The potential output from the analog power supply circuit 61 is commonly supplied to substrate drivers 62 of the SRAMs.

When the substrate potential is forwardly biased, the threshold voltage is decreased, and as a result, the access time becomes shorter. On the other hand, when the substrate potential is backwardly biased, the threshold voltage is increased, and as a result, the leak current is restricted. The substrate potential is commonly controlled among a plurality of memory systems as shown in FIG. 14, whereby restriction of the leak current in consideration of environmental changes of the system and improvement of the access time are readily realized.

According to the present invention, the leak current related problems can be alleviated without increasing the cost of production process. Thus, the present invention is useful in a semiconductor system which is formed using a state-of-the-art miniaturization process and incorporates a system LSI and analog power supply circuit.

What is claimed is:

1. A semiconductor system, comprising:
    a plurality of memory systems which have different threshold voltages; and
    a source potential supply section which is common to the plurality of memory systems, the source potential supply section supplying a source potential to a source of at least one transistor included in a memory cell of each of the memory systems, wherein the source potential is set to a potential different from a ground potential and a supply voltage of the semiconductor system.

2. The semiconductor system of claim 1, wherein the transistor to which the source potential is supplied from the source potential supply section is an access transistor.

3. The semiconductor system of claim 1, wherein:
the plurality of memory systems include an SRAM; and
in the SRAM, the transistor to which the source potential is supplied from the source potential supply section is a load transistor.

4. The semiconductor system of claim 1, wherein the source potential is set to a positive potential whose absolute value is equal to or smaller than 20% of the supply voltage of the semiconductor system.

5. The semiconductor system of claim 1, wherein the source potential is set to a potential whose absolute value is equivalent to a difference between a lowest one of threshold voltages of the memory systems and a highest one of threshold voltages of circuit systems included in the semiconductor system.

6. The semiconductor system of claim 1, wherein at least one of the plurality of memory systems includes a source driver for supplying to a memory cell selected for access the ground potential as a source potential in substitution for the source potential supplied from the source potential supply section.

7. A semiconductor system, comprising:
a plurality of memory systems which have different threshold voltages; and
a source potential supply section which is common to the plurality of memory systems, the source potential supply section supplying a source potential to a word line driver of each of the memory systems,
wherein the source potential is set to a potential different from a ground potential and a supply voltage of the semiconductor system.

8. The semiconductor system of claim 7, wherein the source potential is set to a negative potential whose absolute value is equal to or smaller than 20% of the supply voltage of the semiconductor system.

9. The semiconductor system of claim 7, wherein the source potential is set to a potential whose absolute value is equivalent to a difference between a lowest one of threshold voltages of the memory systems and a highest one of threshold voltages of circuit systems included in the semiconductor system.

10. The semiconductor system of claim 1 or 7, further comprising a circuit system,
wherein the plurality of memory systems are provided together with the circuit system on the same chip to constitute a system LSI.

11. The semiconductor system of claim 1 or 7, wherein the source potential supply section has a function of controlling the source potential according to at least any one of the operation frequency, supply voltage and temperature of the semiconductor system.

12. The semiconductor system of claim 1 or 7, wherein:
the source potential supply section includes a reference voltage generation section for generating a reference voltage as a reference for the source potential; and
the semiconductor system further comprises a voltage controlled driver for generating the source potential which is to be supplied to each of the memory systems according to the reference voltage.

13. The semiconductor system of claim 12, wherein the reference voltage generation section has a function of controlling the reference voltage according to at least any one of the operation frequency, supply voltage and temperature of the semiconductor system.

14. The semiconductor system of claim 1 or 7, further comprising a substrate potential supply section which is common to the plurality of memory systems, the substrate potential supply section supplying a substrate potential to the memory systems.

* * * * *